United States Patent
McLaughlin

(10) Patent No.: US 11,769,648 B2
(45) Date of Patent: Sep. 26, 2023

(54) ION SOURCE GAS INJECTION BEAM SHAPING

(71) Applicant: Applied Materials, Inc., Santa Clara, CA (US)

(72) Inventor: Adam M. McLaughlin, Merrimac, MA (US)

(73) Assignee: Applied Materials, Inc., Santa Clara, CA (US)

( * ) Notice: Subject to any disclaimer, the term of this patent is extended or adjusted under 35 U.S.C. 154(b) by 96 days.

(21) Appl. No.: 17/513,245

(22) Filed: Oct. 28, 2021

(65) Prior Publication Data

US 2023/0133101 A1  May 4, 2023

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/05* (2013.01)

(58) Field of Classification Search
CPC .... H01J 37/08; H01J 37/3171; H01J 2237/02; H01J 2237/083
See application file for complete search history.

(56) References Cited

U.S. PATENT DOCUMENTS

| | | | |
|---|---|---|---|
| 6,686,601 B2 | 2/2004 | Murrell et al. | |
| 10,600,608 B1* | 3/2020 | Adachi | H01J 27/22 |
| 2011/0240878 A1* | 10/2011 | Benveniste | H01J 37/3171 |
| | | | 250/424 |
| 2016/0111250 A1* | 4/2016 | Sato | H01J 37/08 |
| | | | 313/153 |
| 2018/0053629 A1 | 2/2018 | Zhang et al. | |
| 2020/0061922 A1 | 2/2020 | Meiners et al. | |
| 2021/0205928 A1 | 7/2021 | Beeby et al. | |

FOREIGN PATENT DOCUMENTS

| | | |
|---|---|---|
| EP | 3657526 A2 | 5/2020 |
| JP | 2016-177870 A | 10/2016 |
| TW | 201817899 A | 5/2018 |

OTHER PUBLICATIONS

International Search Report and Written Opinion dated Feb. 8, 2023 in corresponding PCT application No. PCT/US2022/045795.

* cited by examiner

*Primary Examiner* — David E Smith
*Assistant Examiner* — Hsien C Tsai
(74) *Attorney, Agent, or Firm* — NIELDS, LEMACK & FRAME, LLC

(57) ABSTRACT

An ion source for extracting a ribbon ion beam with improved height uniformity is disclosed. Gas nozzles are disposed in the chamber proximate the extraction aperture. The gas that is introduced near the extraction aperture serves to shape the ribbon ion beam as it is being extracted. For example, the height of the ribbon ion beam may be reduced by injecting gas above and below the ion beam so as to compress the extracted ion beam in the height direction. In some embodiments, the feedgas is introduced near the extraction aperture. In other embodiments, a shield gas, such as an inert gas, is introduced near the extraction aperture.

20 Claims, 10 Drawing Sheets

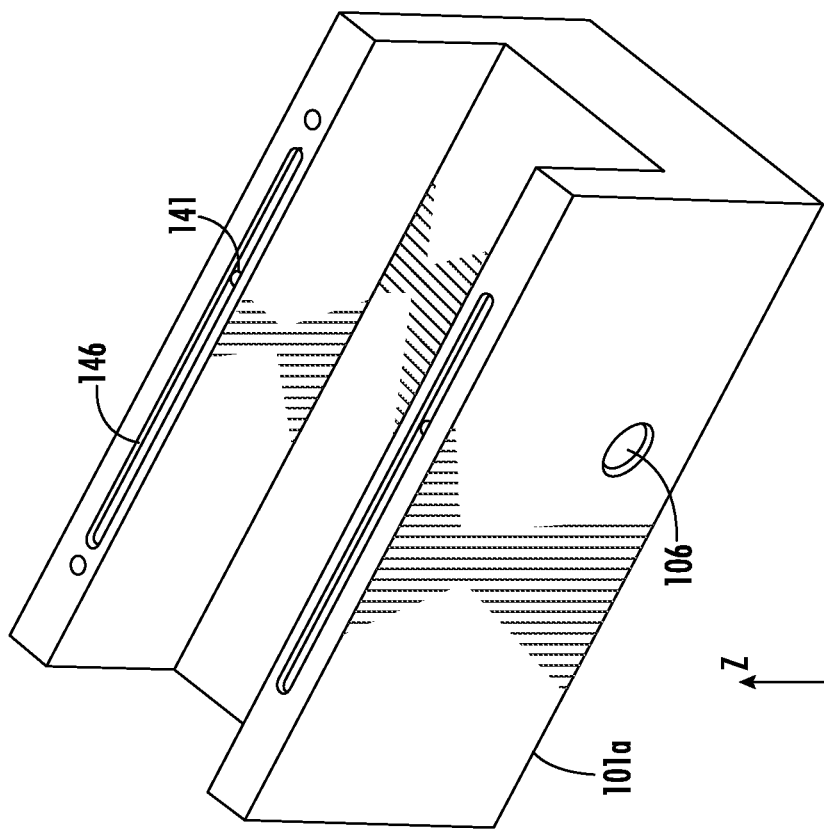
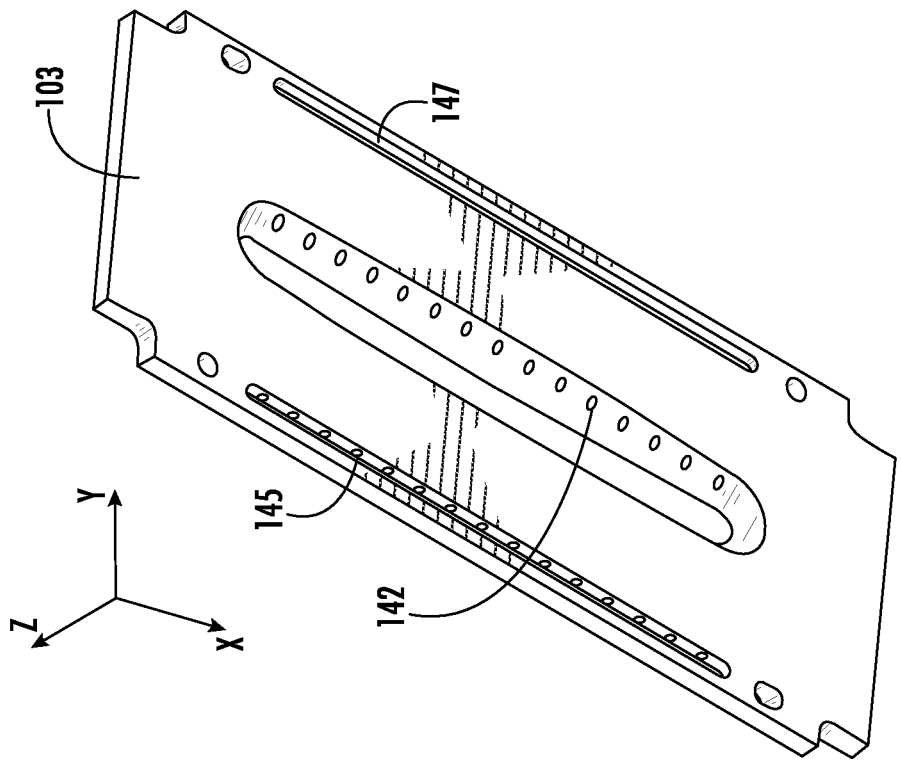

ION SOURCE GAS INJECTION BEAM SHAPING

FIELD

Embodiments of the present disclosure relate to systems injecting gas into an ion source to shape the extracted ion beam.

BACKGROUND

Semiconductor devices are fabricated using a plurality of processes, some of which implant ions into the workpiece. Various ion sources may be used to create the ions. One such ion source is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the end of the chamber opposite the cathode.

In certain embodiments, the IHC ion source is configured to extract a ribbon ion beam, where a width of the ribbon ion beam is much larger than the height of the ribbon ion beam. Unfortunately, in many systems, due to non-uniformity of the plasma density within the ion source, the height of the extracted ion beam is not constant. For example, the height of the ribbon ion beam may be greater near the center of the extraction aperture, if the plasma density is greatest in the middle of the chamber.

Varying height of the ion beam may be problematic as it may cause non-uniformity in the implant dose. Therefore, in some ion implantation systems, additional components, such as lenses are used to correct for this issue. However, these additional components add cost and complexity.

Therefore, it would be beneficial if there was a system that could control the uniformity of the height of a ribbon ion beam being extracted from an ion source.

SUMMARY

An ion source for extracting a ribbon ion beam with improved height uniformity is disclosed. Gas nozzles are disposed in the chamber proximate the extraction aperture. The gas that is introduced near the extraction aperture serves to shape the ribbon ion beam as it is being extracted. For example, the height of the ribbon ion beam may be reduced by injecting gas above and below the ion beam so as to compress the extracted ion beam in the height direction. In some embodiments, the feedgas is introduced near the extraction aperture. In other embodiments, a shield gas, such as an inert gas, is introduced near the extraction aperture.

According to one embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; a plasma generator to generate a plasma within the chamber; a gas inlet in communication with gas channels; a supply channel in communication with the gas inlet to supply feedgas to the chamber; and gas nozzles disposed within the chamber near the extraction aperture, in communication with the gas channels to provide a flow of feedgas near the extraction aperture. In some embodiments, the plurality of walls comprises a bottom wall opposite the extraction plate and side walls that are adjacent to the extraction plate, and wherein the gas channels are disposed in the side walls. In some embodiments, the plurality of walls comprises a bottom wall opposite the extraction plate and side walls that are adjacent to the extraction plate, and wherein the gas channels comprise tubes disposed proximate an interior or exterior surface of the side walls. In some embodiments, the ion source comprises plate gas channels disposed in the extraction plate and in communication with the gas channels, wherein the gas nozzles are disposed on an interior surface of the extraction plate proximate the extraction aperture. In certain embodiments, the plurality of walls comprises a bottom wall opposite the extraction plate and side walls that are adjacent to the extraction plate, and wherein the gas nozzles are disposed on interior surfaces of the side walls proximate the extraction plate. In some embodiments, the extraction plate comprises a face plate and an extraction liner disposed between an interior of the chamber and the face plate, wherein the extraction liner is formed such that there is a gap between the extraction liner and the face plate, wherein the gap is in communication with the gas channels, and further comprising plate gas channels disposed in the extraction liner and in communication with the gap, wherein the gas nozzles are disposed on a surface of the extraction liner proximate the extraction aperture. In some embodiments, a dimension of the gas nozzles varies along the width of the extraction aperture to achieve an improved height uniformity of an extracted ribbon ion beam. In some embodiments, the plasma generator comprises an indirectly heated cathode (IHC).

According to another embodiment, an ion implantation system is disclosed. The ion implantation system comprises the ion source described above, a mass analyzer and a platen.

According to another embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; a plasma generator to generate a plasma within the chamber; a gas inlet in communication with gas channels; gas nozzles disposed near the extraction aperture, in communication with the gas channels; and a second gas inlet in communication with a supply channel to supply feedgas to the chamber; wherein the supply channel and the gas channels are not in fluid communication with one another. In some embodiments, the plurality of walls comprises a bottom wall opposite the extraction plate and side walls that are adjacent to the extraction plate, and wherein the gas channels are disposed in the side walls. In some embodiments, the plurality of walls comprises a bottom wall opposite the extraction plate and side walls that are adjacent to the extraction plate, and wherein the gas channels comprise tubes disposed proximate an interior or exterior surface of the side walls. In some embodiments, the ion source comprises plate gas channels disposed in the extraction plate and in communication with the gas channels, wherein the gas nozzles are disposed on an interior surface of the extraction plate proximate the extraction aperture. In certain embodiments, the plurality of walls comprises a bottom wall opposite the extraction plate and side walls that are adjacent to the extraction plate, and wherein the gas nozzles are disposed on interior surfaces of the side walls proximate the extraction plate. In some embodiments, the extraction plate comprises a face plate and an extraction liner disposed between an interior of the chamber and the face plate, wherein the extraction liner is formed such that there is a gap between the extraction liner and the face plate, wherein the gap is in communication with the gas channels, and further comprising plate gas channels disposed in the extraction liner and in communication with the gap, wherein the gas nozzles are disposed on a surface of the extraction liner proximate the extraction aperture. In some embodiments, the ion source comprises a first gas container in fluid communication with the gas inlet and a second gas container in fluid communication with the second gas inlet. In some embodiments, the ion source comprises a gas container in fluid communication with a first mass flow controller and a second mass flow controller, wherein the first mass flow controller controls a flow rate through the gas inlet and the second mass flow controller controls a flow rate through the second gas inlet. In some embodiments, the flow rate through the gas inlet and the second gas inlet is independently controlled. In some embodiments, a dimension of the gas nozzles varies along the width of the extraction aperture to achieve an improved height uniformity of an extracted ribbon ion beam. In some embodiments, the plasma generator comprises an indirectly heated cathode (IHC).

According to another embodiment, an ion implantation system is disclosed. The ion implantation system comprises the ion source described above, a mass analyzer and a platen.

BRIEF DESCRIPTION OF THE FIGURES

For a better understanding of the present disclosure, reference is made to the accompanying drawings, which are incorporated herein by reference and in which:

FIGS. 4B-4C show the extraction plate and side walls, respectively, of the ion source of FIG. 4A;

DETAILED DESCRIPTION

Figure 1:
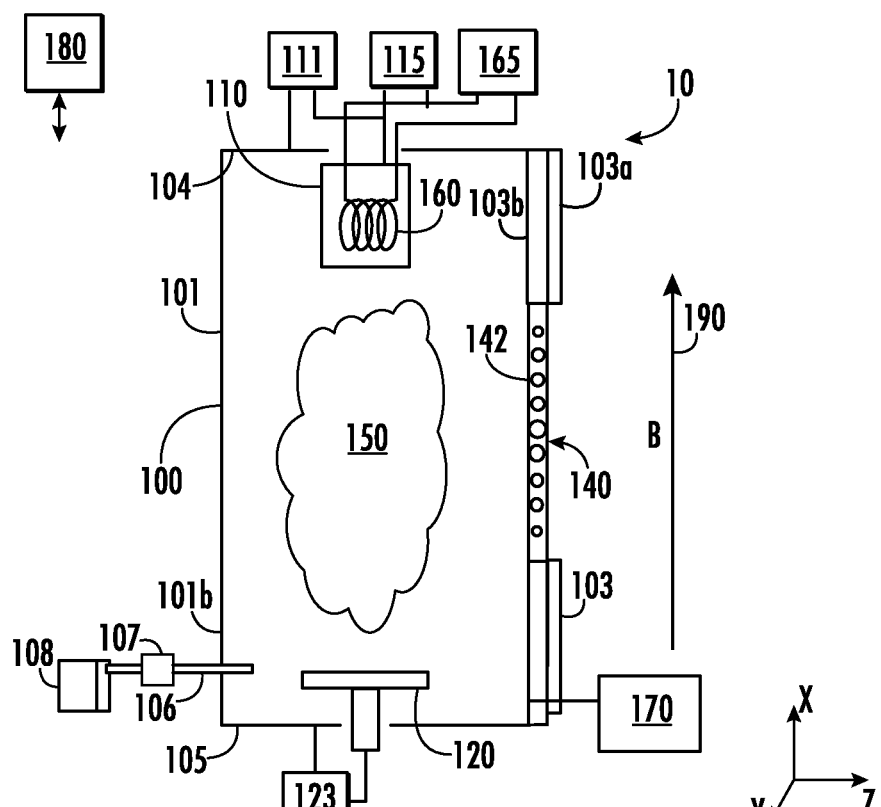
FIG. 1 shows a block diagram of an ion source according to one embodiment.

FIG. 1 shows a cross-sectional view of an IHC ion source 10 that may be utilized to extract a ribbon ion beam with improved uniformity in the height direction. The IHC ion source 10 includes a chamber 100, comprising two opposite ends, and walls 101 connecting to these ends. These walls 101 include side walls 101a, an extraction plate 103 and a bottom wall 101b opposite the extraction plate 103. Thus, the side walls 101a are the walls that are adjacent to the extraction plate 103 along the width direction. In certain embodiments, the side walls 101a and the bottom wall 101b may be an integral component. The two opposite ends are adjacent to the extraction plate 103 along the height direction.

The extraction plate 103 has a height, width and a thickness. The extraction plate 103 includes an extraction aperture 140 that passes through the extraction plate 103 in the thickness direction. Ions are extracted through the extraction aperture 140. The extraction aperture 140 may be much larger in the width direction, also referred to as the X direction, than in the height direction, also referred to as the Y direction. The Z direction is defined along the thickness of the extraction plate 103 and is defined as the direction of travel for the ribbon ion beam. For example, the extraction aperture 140 may be greater than 3 inches in the width direction and less than 0.3 inches in the height direction.

In certain embodiments, the extraction plate 103 may comprise a face plate 103a and an extraction liner 103b, wherein the extraction liner 103b is disposed between the interior of the chamber 100 and the face plate 103a. The extraction liner 103b may be a replaceable component. In certain embodiments, the face plate 103a and the extraction liner 103b are both constructed from tungsten, although other suitable materials may be used.

The walls 101 of the chamber 100 may be constructed of an electrically conductive material and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into chamber 100 to ionize the neutral gas. The current drawn by this arc voltage power supply 111 is a measurement of the amount of current being driven through the plasma 150. In certain embodiments, the walls 101 provide the ground reference for the other power supplies.

In this embodiment, a repeller 120 may be disposed in the chamber 100 on the second end 105 of the chamber 100 opposite the cathode 110.

The repeller 120 may be in electrical communication with a repeller power supply 123. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 123 or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the x direction). Thus, electrons do not experience electromagnetic force to move in the x direction. However, movement of the electrons in other directions may experience an electromagnetic force.

One or more gas containers 108 may be in communication with the chamber 100 via a gas inlet 106. Each gas container 108 may include a mass flow controller (MFC) 107 so as to regulate a flow of gas from each gas container.

An extraction power supply 170 may be used to bias the walls 101 of the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

A controller 180 may be in communication with one or more of the power supplies such that the voltage or current supplied by these power supplies may be monitored and/or modified. Additionally, the controller 180 may be in communication with the MFCs 107 of each gas container 108 so as to regulate a flow of each gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 2:
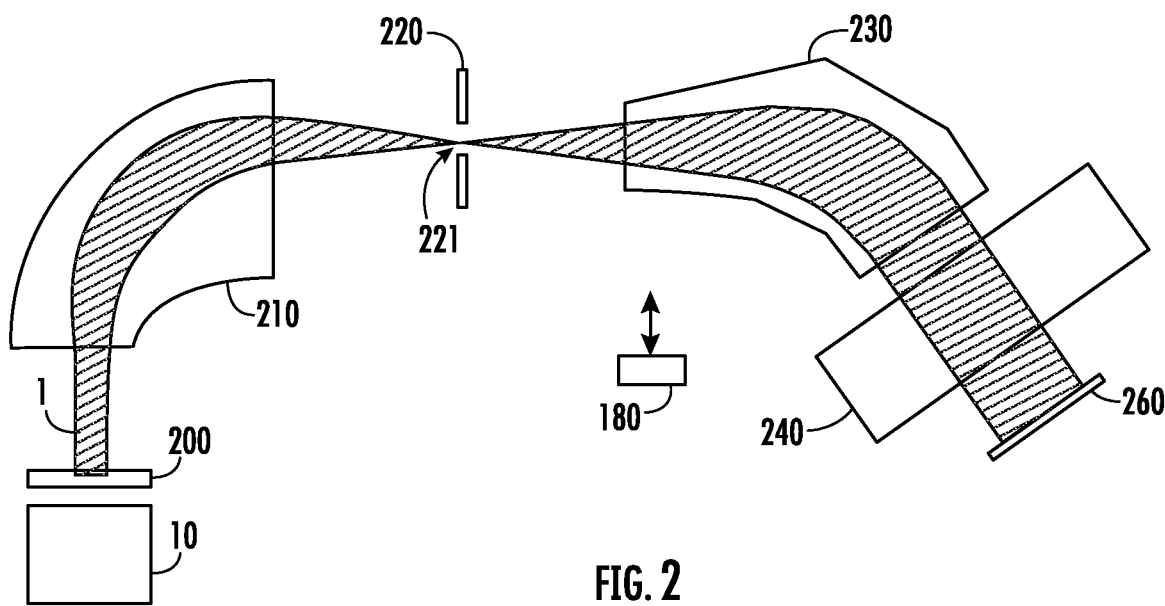
FIG. 2 is a block diagram of an ion implantation system that uses the IHC ion source of FIG. 1.

FIG. 2 shows an ion implantation system using the IHC ion source 10 of FIG. 1. Disposed outside and proximate the extraction aperture of the IHC ion source 10 are one or more electrodes 200.

Located downstream from the electrodes 200 is a mass analyzer 210. The mass analyzer 210 uses magnetic fields to guide the path of the extracted ribbon ion beam 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the extracted ribbon ion beam 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the extracted ribbon ion beam 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

The height of the extracted ribbon ion beam is improved by directing a gas toward the extraction aperture 140. The gas flow serves to reduce the height of the extracted beam. This may be achieved in a plurality of different ways.

Figure 3A:
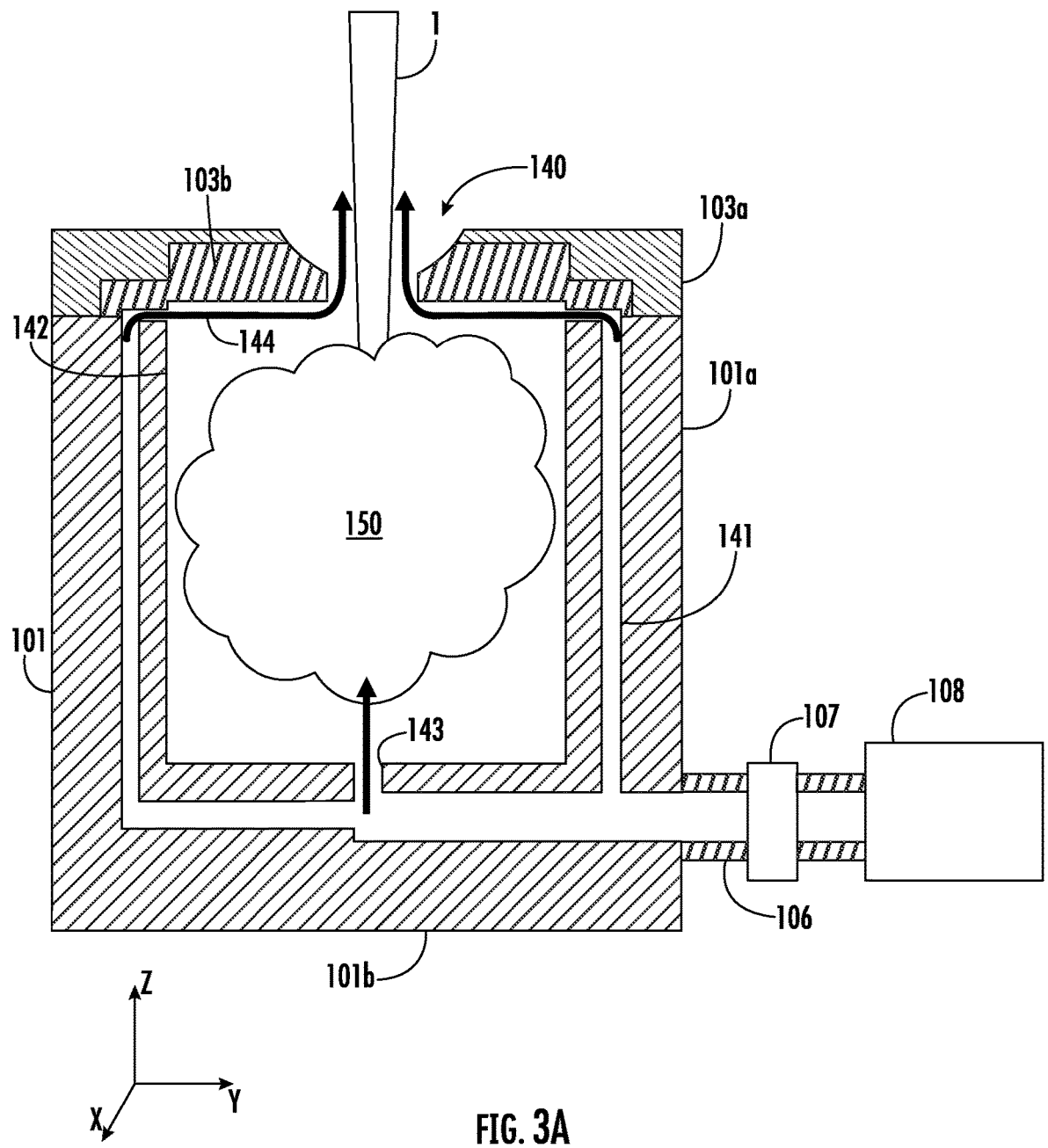
FIG. 3A shows a cross-sectional view of the ion source according to one embodiment.
Figure 3B:
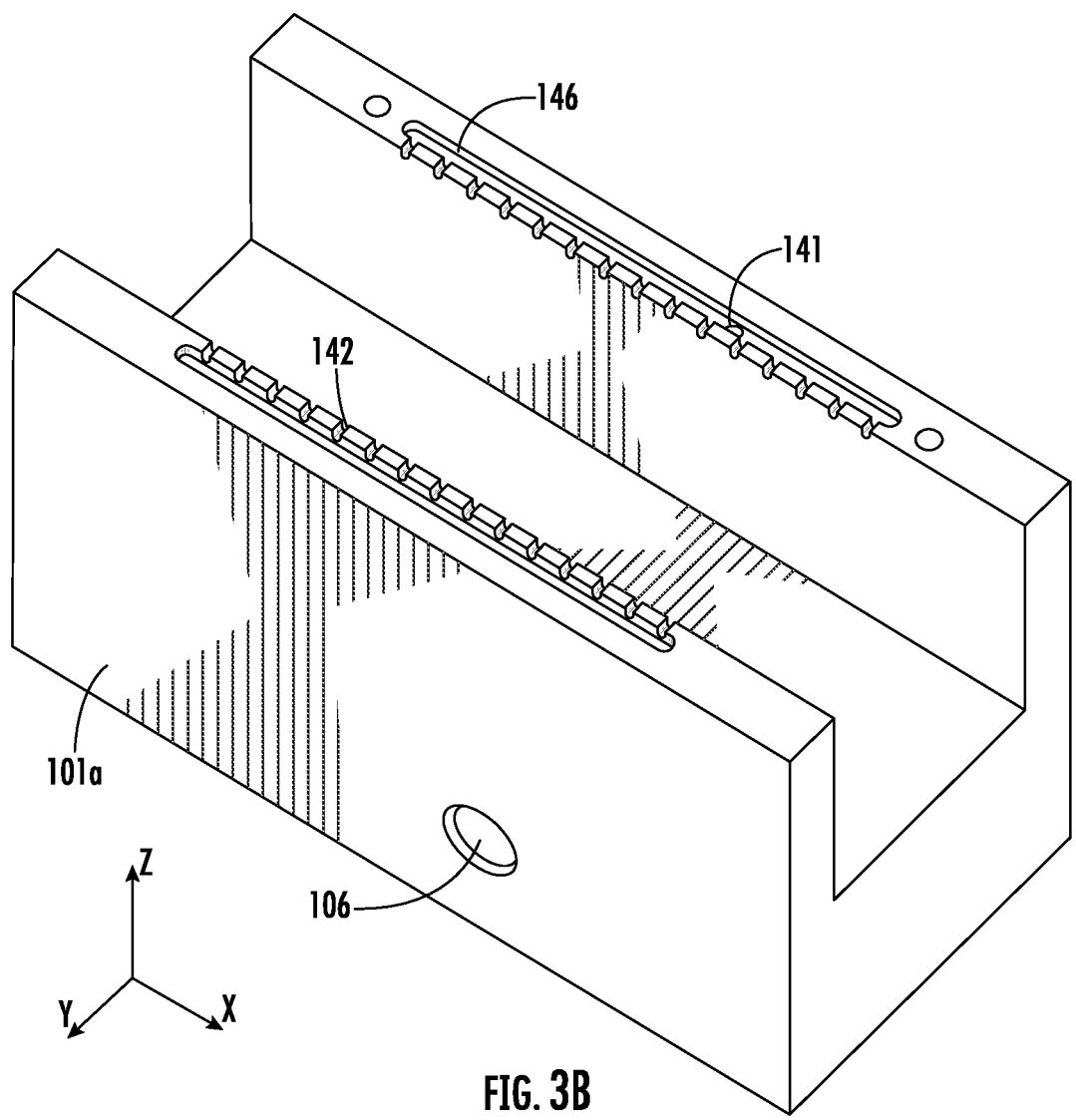
FIG. 3B shows the side walls of the ion source of FIG. 3A.

In the embodiment shown in FIGS. 3A-3B, the IHC ion source 10 may comprise gas channels 141 that terminate in gas nozzles 142 located at or near the interface between the side walls 101a and the extraction plate 103. FIG. 3A shows a cross-sectional view of the IHC ion source 10, while FIG. 3B shows the side walls 101a of the ion source according to this embodiment. In this embodiment, as best seen in FIG. 3A, a feedgas is disposed in gas container 108. This feedgas enters the chamber 100 via the gas inlet 106.

The flow rate of the feedgas is controlled by the MFC 107. The gas inlet 106 may be in communication with one or more supply channels 143 that supply the feedgas to the interior of the chamber 100. In certain embodiments, the supply channels 143 may be disposed on the bottom wall 101b. In other embodiments, the supply channels 143 may be disposed on one or more of the side walls 101a.

Additionally, the gas inlet 106 may be in communication with one or more gas channels 141 that are disposed inside the walls 101. For example, the gas channels 141 may be created by machining one or more channels in the side walls 101a. In another embodiment, the gas channels 141 may be created by providing tubes that are disposed along an interior or exterior surface of the side walls 101a. In both embodiments, the gas is directed toward the end of the side walls 101a nearest the extraction plate 103.

In this embodiment, the gas channels 141 terminate at the top surface of the side wall 101a proximate the interface between the side wall 101a and the extraction plate 103. The gas channels 141 may be disposed within the side walls 101a. Thus, in this embodiment, as shown by arrow 144 in FIG. 3A, the feedgas exits the gas channels 141 via gas nozzles 142 in the side walls 101a and flows along the interior surface of the extraction plate 103 before reaching the extraction aperture 140. For example, as shown in FIG. 3B, a plurality of gas nozzles 142 may be arranged on the interior surfaces of the side walls 101a on either side of the extraction plate 103, where the extraction plate 103 meets the side walls 101a. The gas channels 141 terminate at the top surface of the side walls 101a in a horizontal groove 146 that extends along the side walls 101a in the X direction. The gas nozzles 142 are each in communication with the horizontal groove 146. Further, the size of each gas nozzle 142 may be same in some embodiments. In other embodiments, the gas nozzles 142 may vary and be dimensioned based on the amount of height adjustment that is to be performed. For example, if the height of the extracted ribbon ion beam 1 is greatest at the center of the extraction aperture 140, the gas nozzles 142 that are aligned with the center of the extraction aperture 140 may be larger than other gas nozzles 142. In this way, more gas flows through these larger nozzles and constrains the extracted ribbon ion beam 1. Note that in this embodiment, the extraction plate 103 is unchanged.

Note that if a tube is used to carry the feedgas along an interior or exterior surface of the side walls 101a, that tube may terminate in the horizontal groove 146.

In a related embodiment, the supply channels 143 may be eliminated. In this embodiment, the feedgas to be ionized enters through the gas nozzles 142.

Figure 4A:
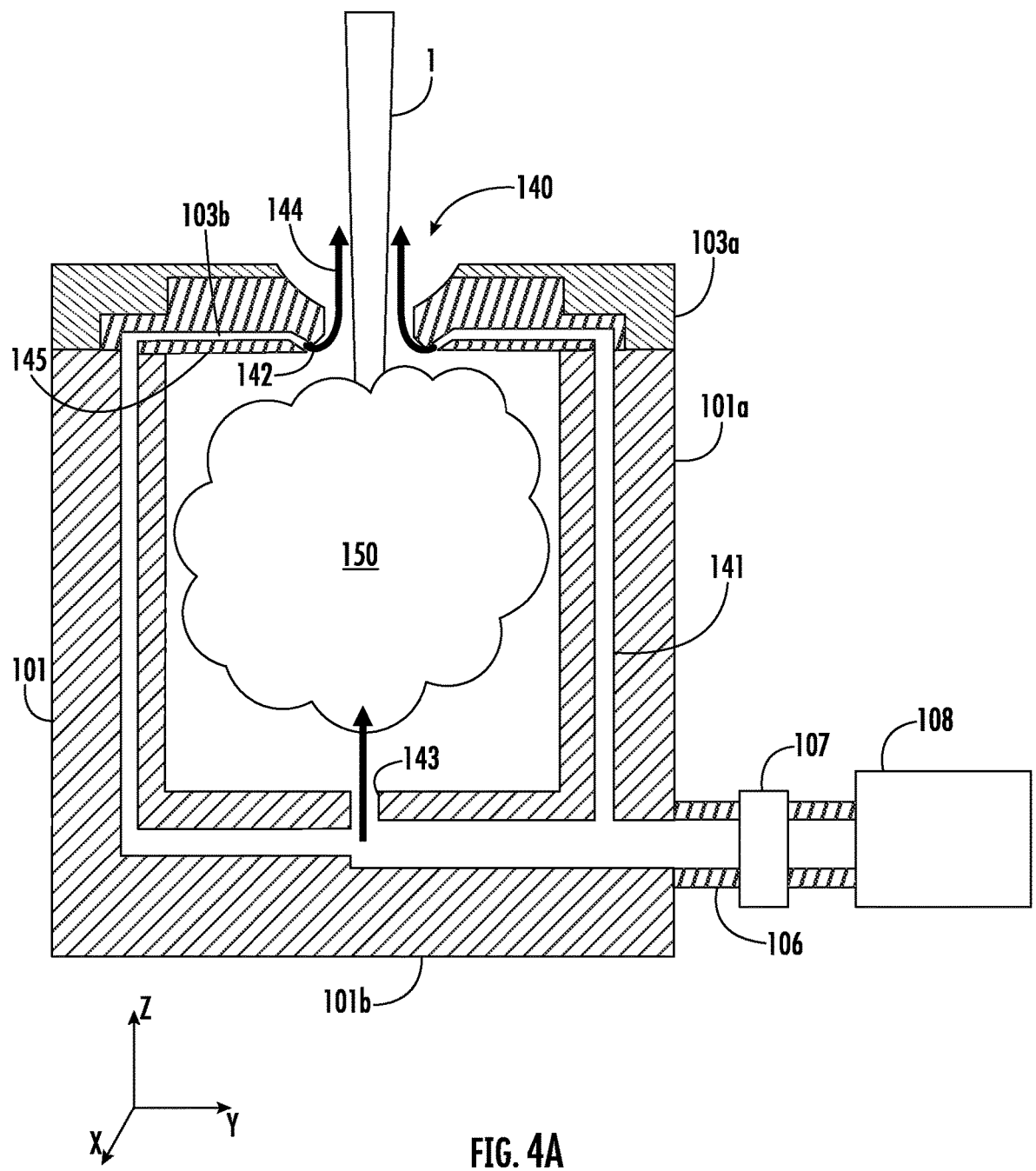
FIG. 4A shows a cross-section view of the ion source according to another embodiment.

FIGS. 4A-4C show a second embodiment. FIG. 4A shows a cross-sectional view of the IHC ion source 10, FIG. 4B shows the extraction liner 103b and FIG. 4C shows the side walls 101a of the ion source according to this embodiment.

In this embodiment, as best seen in FIG. 4A, a feedgas is disposed in gas container 108. This feedgas enters the chamber 100 via the gas inlet 106. The flow rate of the feedgas is controlled by the MFC 107. The gas inlet 106 may be in communication with one or more supply channels 143 that supply the feedgas to the interior of the chamber 100. In certain embodiments, the supply channels 143 may be disposed on the bottom wall 101b. In other embodiments, the supply channels 143 may be disposed on one or more of the side walls 101a.

Additionally, the gas inlet 106 may be in communication with one or more gas channels 141 that are disposed inside the walls 101. For example, the gas channels 141 may be created by machining one or more channels in the side walls 101a. In another embodiment, the gas channels 141 may be created by providing tubes that are disposed along an interior or exterior surface of the side walls 101a. In both embodiments, the gas is directed toward the end of the side walls 101a nearest the extraction plate 103.

In this embodiment, the gas channels 141 terminate at the top surface of the side wall 101a proximate the interface between the side wall 101a and the extraction plate 103. The gas channels 141 may be disposed within the side walls 101a. As shown in FIG. 4C, the gas channels 141 terminate at the top surface of the side walls 101a in a horizontal groove 146 that extends along the X direction.

In this embodiment, the horizontal grooves 146 in the side walls 101a are in communication with a corresponding horizontal plate groove 147 in the extraction plate 103, as shown in FIG. 4B. The horizontal plate groove 147 is in communication with a plurality of plate gas channels 145, which are disposed within the extraction plate 103. In certain embodiments, the horizontal plate groove 147 and the plate gas channels 145 are disposed in the extraction liner 103b. The horizontal plate groove 147 may be positioned such that it overlaps the horizontal groove 146 in the side walls 101a when assembled. In this way, the gas channels 141 in the side walls 101a supply feedgas to the horizontal groove 146, which is coupled to the horizontal plate groove 147. The feedgas then enters the plate gas channels 145 in the extraction plate 103. The feedgas then exits the plate gas channels 145 through gas nozzles 142. The gas nozzles 142 are located on the interior surface of the extraction plate 103, near the extraction aperture 140, such as within 0.25 inches. In some embodiments, the gas nozzles 142 may be located within 0.1 inches of the extraction aperture 140. In this embodiment, the gas nozzles 142 are closer to the extraction aperture 140 than the embodiment shown in FIGS. 3A-3B and may be more effective at shaping the extracted ribbon ion beam 1. The dimensions of the various gas nozzles 142 may be as described above.

Note that if a tube is used to carry the feedgas along an interior or exterior surface of the side walls 101a, that tube may terminate in the horizontal groove 146 or in the horizontal plate groove 147.

In a related embodiment, the supply channels 143 may be eliminated. In this embodiment, the feedgas to be ionized enters through the gas nozzles 142.

Figure 5A:
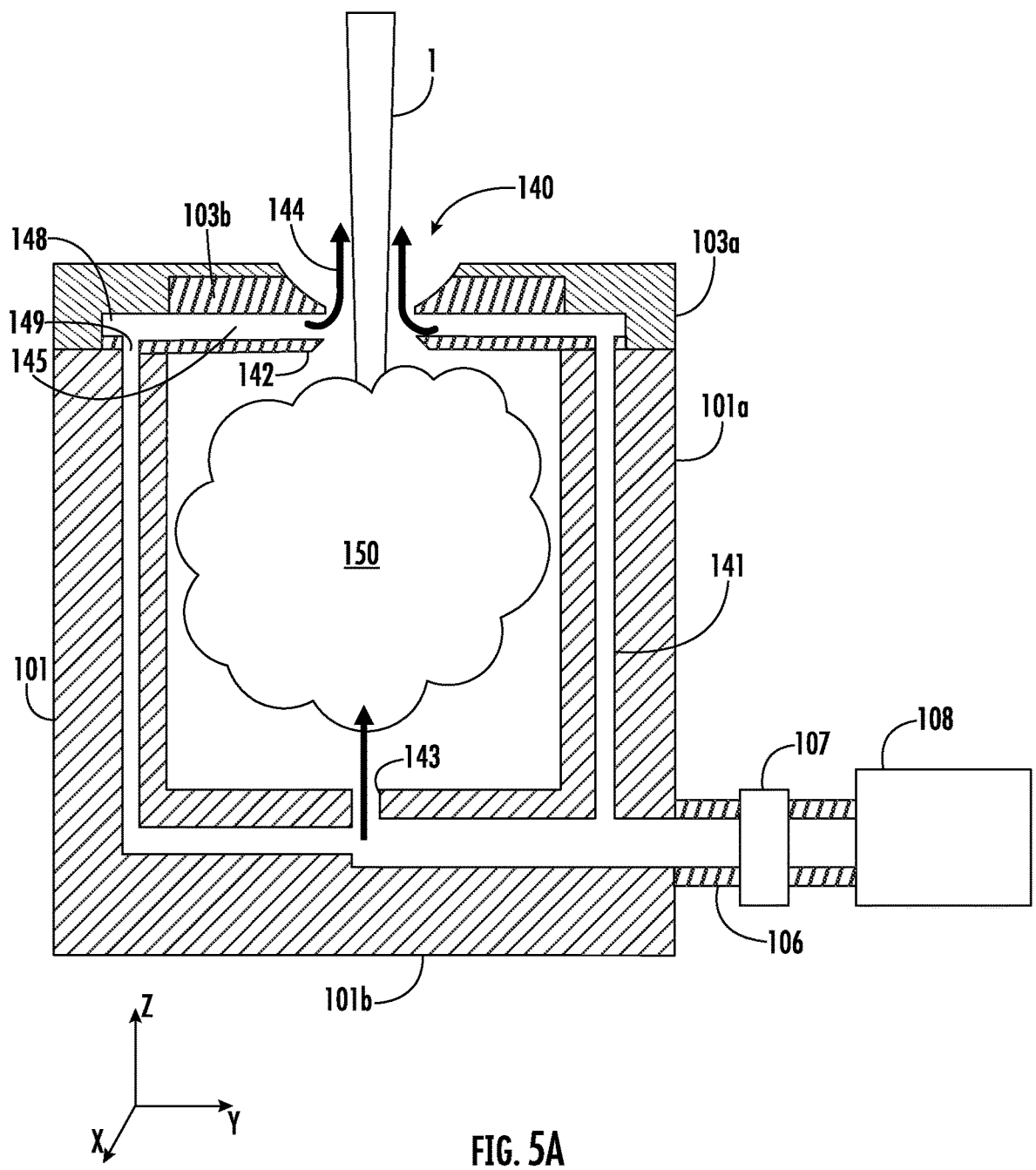
FIG. 5A shows a cross-section view of the ion source according to a third embodiment.
Figure 5B:
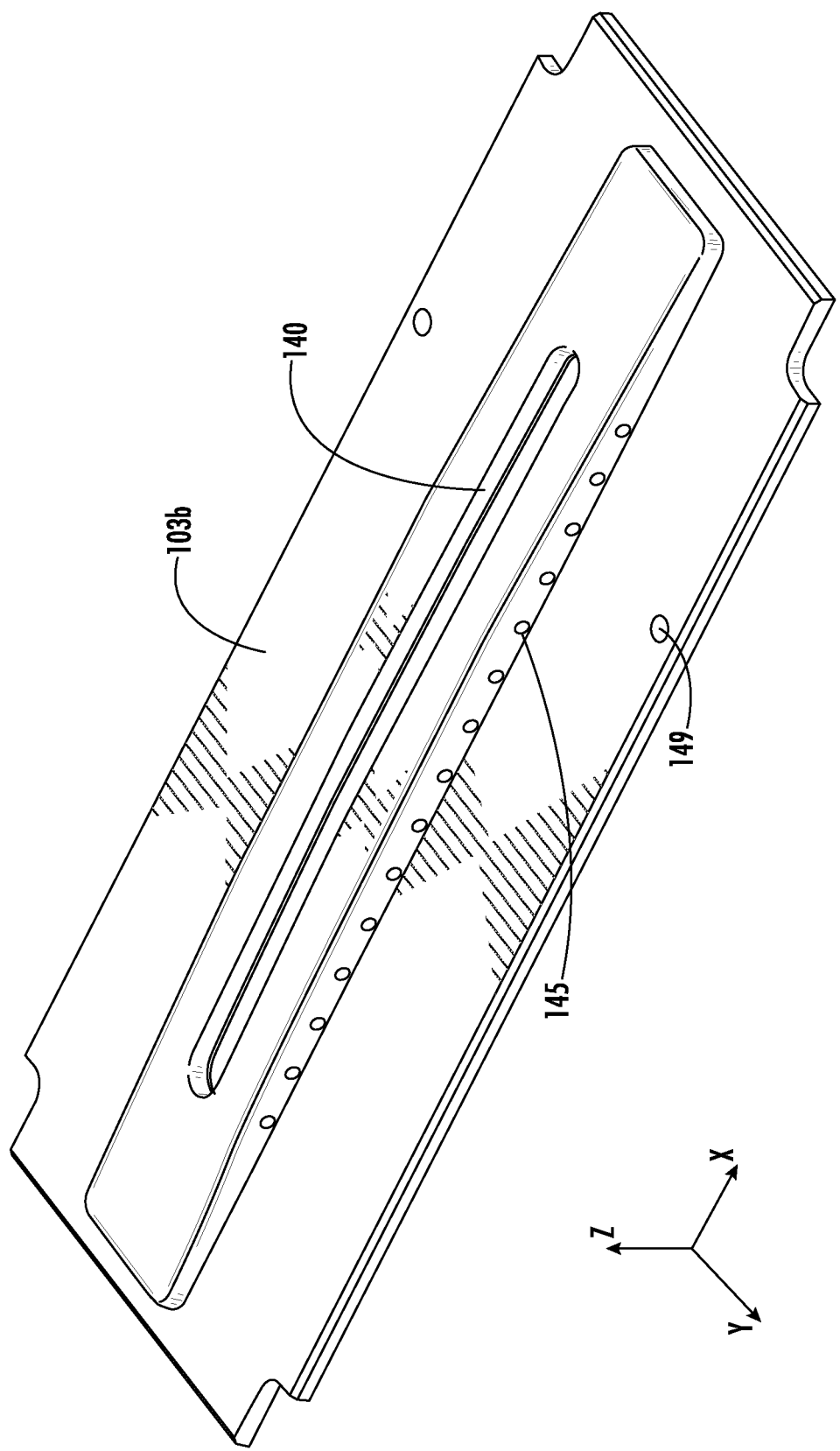
FIG. 5B shows the extraction plate of the ion source of FIG. 5A.

FIGS. 5A-5B show another embodiment. FIG. 5A shows a cross-sectional view of the IHC ion source 10, while FIG. 5B shows the extraction liner 103b. In this embodiment, as shown in FIG. 5A, the extraction liner 103b is formed such that there is a gap 148 between the top surface of the side walls 101a and the face plate 103a. A hole 149 in the extraction liner 103b allows fluid communication between the gas channels 141 and the gap 148.

The gap 148 is in communication with a plurality of plate gas channels 145, which are disposed within the extraction liner 103b. In this embodiment, the horizontal groove 146 may not be present. Rather, the gas channels 141 may be aligned with the hole 149 to allow feedgas to flow directly into the gap 148. Other aspects of this embodiment may be similar to those described with respect to the embodiment shown in FIGS. 4A-4B.

FIGS. 3A, 4A and 5A all show the gas channels 141 and the supply channel 143 in communication with the same gas inlet 106. However, in other embodiments, there may be two gas inlets, where the flow of gas entering each gas inlet may be independently controlled using separate mass flow controller (MFC) 107. In this way, the flow rate of the gas introduced near the extraction aperture 140 may not be related to the flow rate of feedgas used for ionization.

Figure 6A:
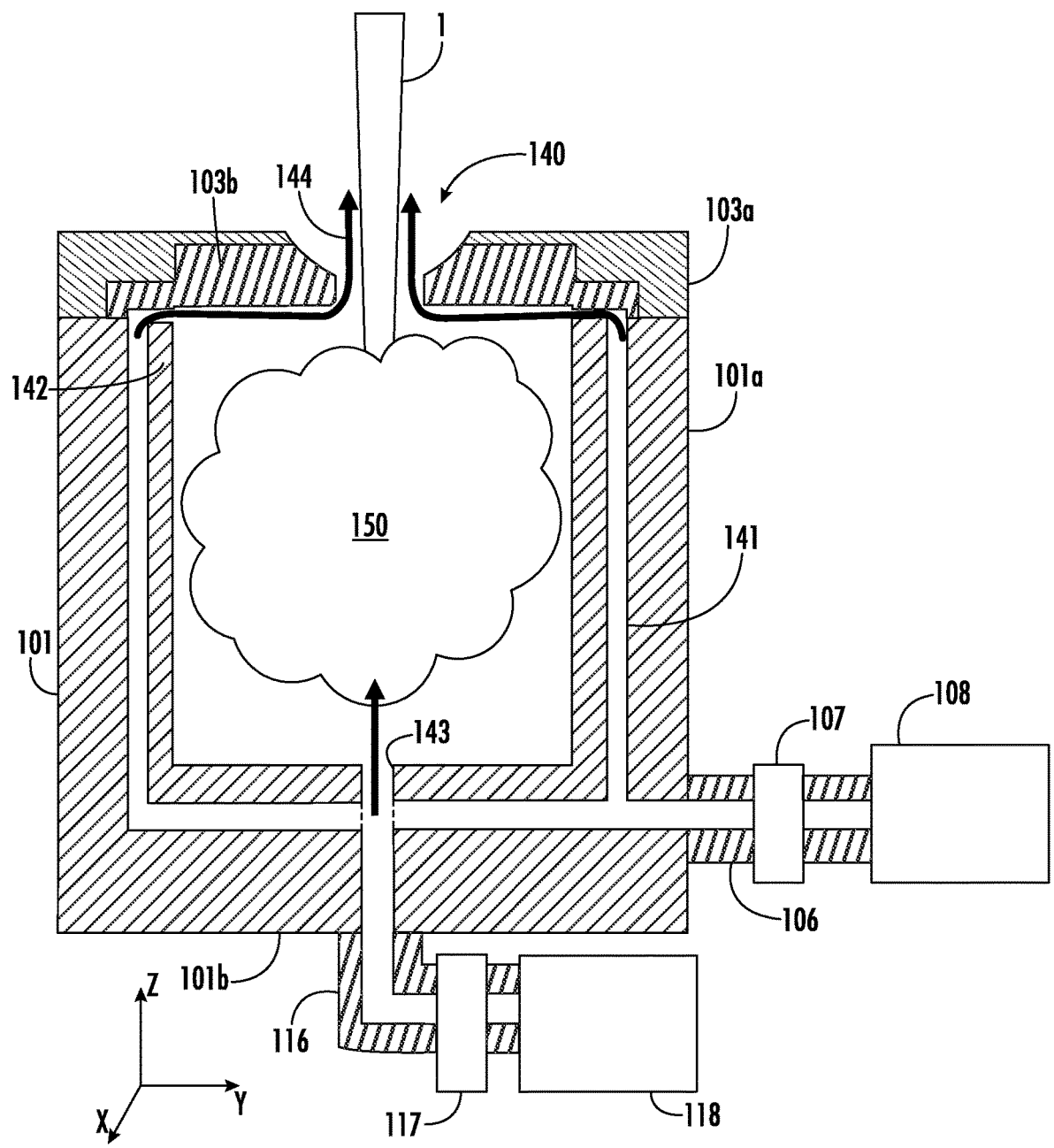
FIGS. 6A-6C show a cross-sectional view of the ion source according to three additional embodiments.
Figure 6B:
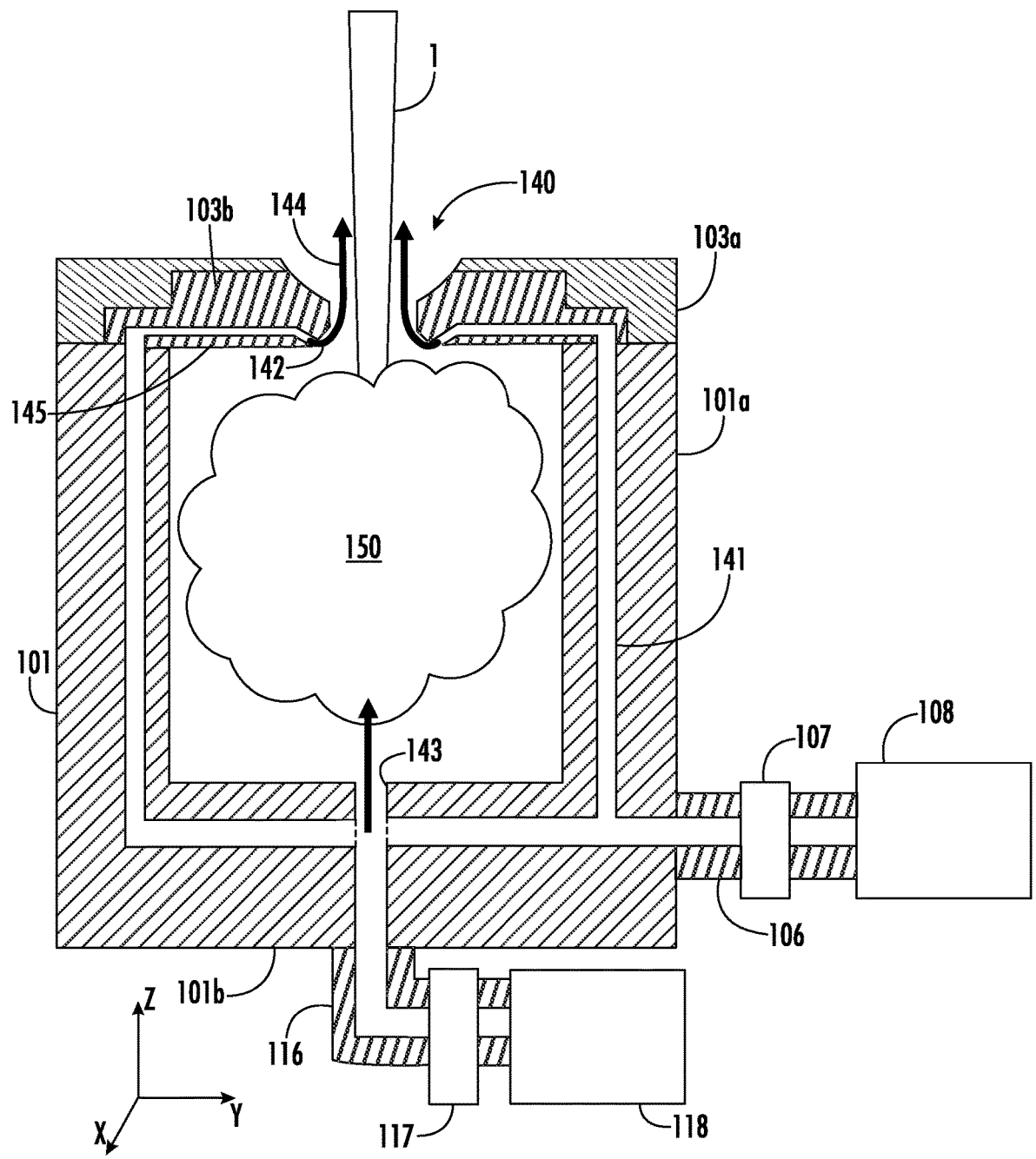
Figure 6C:
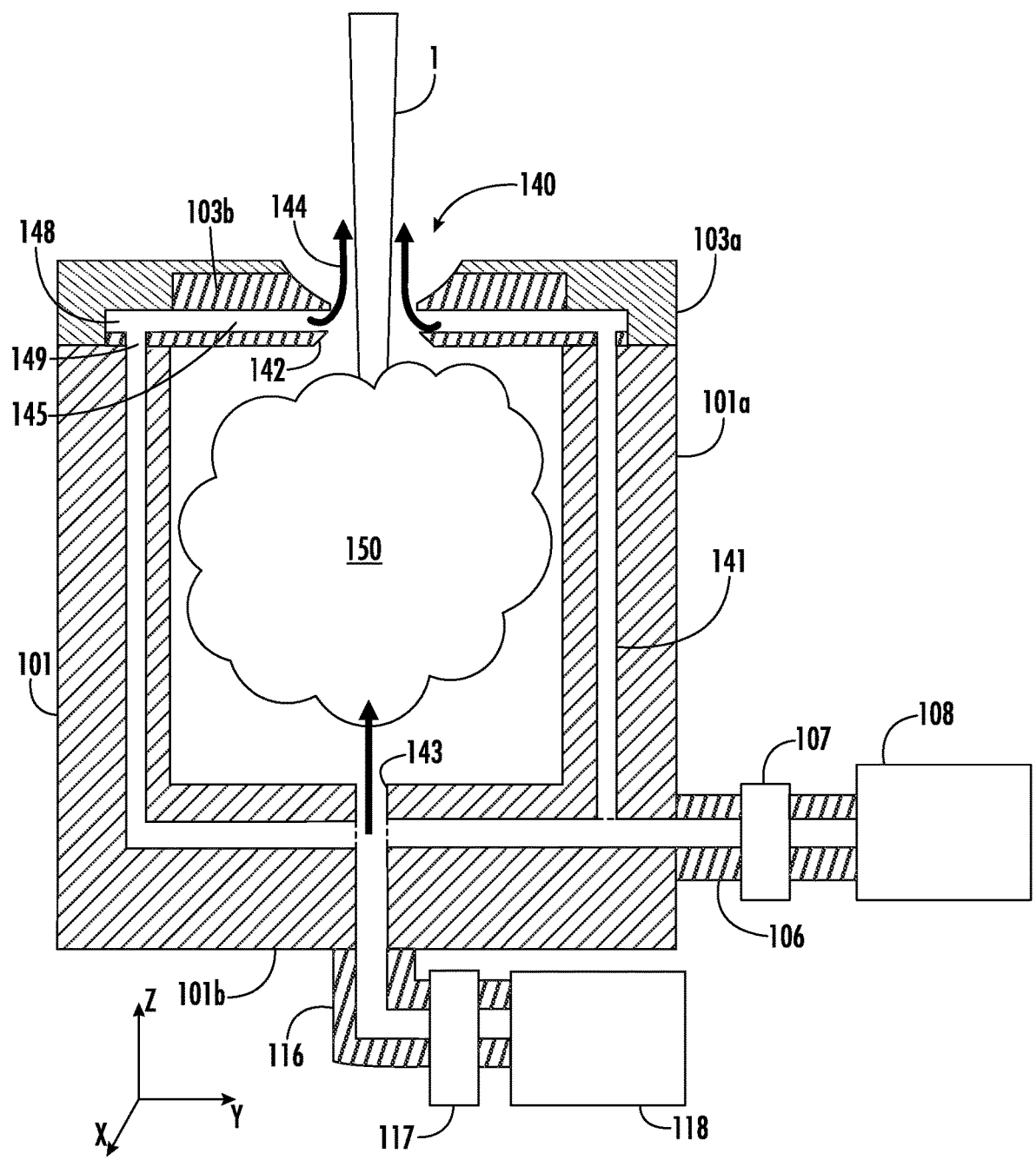

FIGS. 6A-6C show three embodiments where the gas inlets are separate. These embodiments correspond to the embodiments of FIGS. 3A, 4A and 5A, respectively.

As described above, the flow rate of gas from gas container 108 is controlled by MFC 107. The gas then passes through gas inlet 106 and enters the gas channels 141. In FIG. 6A, the gas channels 141 terminate near the interface between the side walls 101a and the extraction plate 103, as described above with respect to FIG. 3A. In FIG. 6B, plate gas channels 145 are disposed in the extraction plate 103, as described above with respect to FIG. 4A. In FIG. 6C, the plate gas channels 145 are disposed in the extraction liner 103b, as described above with respect to FIG. 5A.

However, in these embodiments, a second gas inlet 116 is used to supply the feedgas to the chamber 100. Specifically, the feedgas may be stored in second gas container 118. The flow rate of the feedgas is controlled by second MFC 117. The feedgas enters via second gas inlet 116. The second gas inlet 116 is in communication with the supply channels 143. Thus, the flow rate of gas through the two gas inlets may be separately controlled.

In these embodiments, the gas channels 141 and the supply channels 143 are completely separated such that there is no fluid communication between the supply channels 143 and the gas channels 141.

While FIGS. 6A-6C show two different gas containers, it is understood that one gas container may be in communication with both MFCs such that gas from a single gas container is used to supply gas to both the supply channels 143 and the gas channels 141. In other words, MFC 107 may be used to regulate the flow of gas through the gas nozzles 142, while second MFC 117 is used to independently control the flow of feedgas into the chamber 100 through supply channels 143. In this way, the two flow rates can be separately controlled and optimized for their respective functions.

In certain embodiments, the use of two separate gas inlets allows the use of two different gasses. For example, a feedgas may be provided in second gas container 118. A shield gas, different from the feedgas, may be stored in gas container 108. The shield gas may be an inert species, such as argon or xenon.

Further, while FIGS. 6A-6C show the supply channels 143 being disposed on the bottom wall 101b of the ion source, it is understood that the position of the supply channels 143 may be modified. For example, the supply channels 143 may enter the chamber 100 via a side wall 101a.

The above describes the ion source as being an IHC ion source. However, other ion sources may also be used with the gas nozzles 142 For example, magnetized DC plasma sources, tubular cathode source, Bernas ion source and inductively coupled plasma (ICP) ion sources may also use gas channels and gas nozzles. Thus, the extraction plate may be used with an ion source having a variety of different plasma generators.

In operation, a gas, which may be the feedgas for the embodiments shown in FIGS. 3A, 4A and 5A, or a shield gas for the embodiments shown in FIGS. 6A-6C, is supplied to the gas channels 141. The gas travels through the gas channels 141 and exits through the gas nozzles 142. The gas flowing near the extraction aperture 140 tends to compress the ribbon ion beam that this being extracted through the extraction aperture 140. To improve the uniformity of the height of the extracted ion beam, the flow rate may be different at different portions of the extraction aperture 140 along the X dimension. For example, larger gas nozzles may be employed in regions where the height of the extracted ion beam is traditionally greatest. In some embodiments, such as those shown in FIGS. 6A-6C, the flow rates of gasses through the gas nozzles 142 may be regulated using the MFC 107, independent of the flow rate of the feedgas, which is controlled by second MFC 117.

The present system has many advantages. The ability to flow a gas, either the feedgas or a shield gas, near the extraction aperture may facilitate shaping of the ribbon ion beam as it is being extracted. Specifically, the flow may compress the flow of ions in the height direction. Traditionally, ribbon ion beams that are extracted from ion sources may be non-uniform in height as a result of plasma shape and the chemistry inside the ion source. By compressing or blocking the flow of some of the ions to account for common non-uniform profiles, an extracted ribbon ion beam having better uniformity in the height direction may be achieved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
   a chamber comprising a first end, a second end and a plurality of walls connecting the first end and the second end, wherein one of the plurality of walls is an extraction plate having an extraction aperture having a width greater than its height;
   a plasma generator to generate a plasma within the chamber;
   a gas inlet in communication with gas channels;
   a supply channel in communication with the gas inlet to supply feedgas to the chamber; and
   gas nozzles disposed within the chamber near the extraction aperture, in communication with the gas channels to provide a flow of feedgas near the extraction aperture so as to shape an ion beam extracted from the ion source.

2. The ion source of claim 1, wherein the plurality of walls comprises a bottom wall opposite the extraction plate and side walls that are adjacent to the extraction plate, and wherein the gas channels are disposed in the side walls.

3. The ion source of claim 1, wherein the plurality of walls comprises a bottom wall opposite the extraction plate and side walls that are adjacent to the extraction plate, and wherein the gas channels comprise tubes disposed proximate an interior or exterior surface of the side walls.

4. The ion source of claim 1, further comprising plate gas channels disposed in the extraction plate and in communication with the gas channels, wherein the gas nozzles are disposed on an interior surface of the extraction plate proximate the extraction aperture.

5. The ion source of claim 1, wherein the plurality of walls comprises a bottom wall opposite the extraction plate and side walls that are adjacent to the extraction plate, and wherein the gas nozzles are disposed on interior surfaces of the side walls proximate the extraction plate.

6. The ion source of claim 1, wherein the extraction plate comprises a face plate and an extraction liner disposed between an interior of the chamber and the face plate, wherein the extraction liner is formed such that there is a gap between the extraction liner and the face plate, wherein the gap is in communication with the gas channels, and further comprising plate gas channels disposed in the extraction liner and in communication with the gap, wherein the gas nozzles are disposed on a surface of the extraction liner proximate the extraction aperture.

7. The ion source of claim 1, wherein a dimension of the gas nozzles varies along the width of the extraction aperture to achieve an improved height uniformity of an extracted ribbon ion beam.

8. The ion source of claim 1, wherein the plasma generator comprises an indirectly heated cathode (IHC).

9. An ion implantation system comprising:
   the ion source of claim 1;
   a mass analyzer; and
   a platen.

10. An ion source comprising:
a chamber comprising a first end, a second end and a plurality of walls connecting the first end and the second end, wherein one of the plurality of walls is an extraction plate having an extraction aperture having a width greater than its height;
a plasma generator to generate a plasma within the chamber;
a gas inlet in communication with gas channels;
gas nozzles disposed within the chamber near the extraction aperture, in communication with the gas channels so as to shape an ion beam extracted from the ion source; and
a second gas inlet in communication with a supply channel to supply feedgas to the chamber;
wherein the supply channel and the gas channels are not in fluid communication with one another.

11. The ion source of claim 10, wherein the plurality of walls comprises a bottom wall opposite the extraction plate and side walls that are adjacent to the extraction plate, and wherein the gas channels are disposed in the side walls.

12. The ion source of claim 10, wherein the plurality of walls comprises a bottom wall opposite the extraction plate and side walls that are adjacent to the extraction plate, and wherein the gas channels comprise tubes disposed proximate an interior or exterior surface of the side walls.

13. The ion source of claim 10, further comprising plate gas channels disposed in the extraction plate and in communication with the gas channels, wherein the gas nozzles are disposed on an interior surface of the extraction plate proximate the extraction aperture.

14. The ion source of claim 10, wherein the plurality of walls comprises a bottom wall opposite the extraction plate and side walls that are adjacent to the extraction plate, and wherein the gas nozzles are disposed on interior surfaces of the side walls proximate the extraction plate.

15. The ion source of claim 10, wherein the extraction plate comprises a face plate and an extraction liner disposed between an interior of the chamber and the face plate, wherein the extraction liner is formed such that there is a gap between the extraction liner and the face plate, wherein the gap is in communication with the gas channels, and further comprising plate gas channels disposed in the extraction liner and in communication with the gap, wherein the gas nozzles are disposed on a surface of the extraction liner proximate the extraction aperture.

16. The ion source of claim 10, further comprising a first gas container in fluid communication with the gas inlet and a second gas container in fluid communication with the second gas inlet.

17. The ion source of claim 10, further comprising a gas container in fluid communication with a first mass flow controller and a second mass flow controller, wherein the first mass flow controller controls a flow rate through the gas inlet and the second mass flow controller controls a flow rate through the second gas inlet, wherein the flow rate through the gas inlet and the second gas inlet is independently controlled.

18. The ion source of claim 10, wherein a dimension of the gas nozzles varies along the width of the extraction aperture to achieve an improved height uniformity of an extracted ribbon ion beam.

19. The ion source of claim 10, wherein the plasma generator comprises an indirectly heated cathode (IHC).

20. An ion implantation system comprising:
the ion source of claim 10;
a mass analyzer; and
a platen.

* * * * *